(12) United States Patent
Ionescu et al.

(10) Patent No.: US 9,277,683 B2
(45) Date of Patent: Mar. 1, 2016

(54) LIQUID COOLED ELECTRONIC MODULES AND METHODS FOR REPLACING THE SAME

(71) Applicants: Bogdan Ionescu, McMurray, PA (US); Peter Willard Hammond, Greensburg, PA (US)

(72) Inventors: Bogdan Ionescu, McMurray, PA (US); Peter Willard Hammond, Greensburg, PA (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 232 days.

(21) Appl. No.: 14/031,097

(22) Filed: Sep. 19, 2013

(65) Prior Publication Data

US 2015/0077936 A1    Mar. 19, 2015

(51) Int. Cl.
H05K 7/20 (2006.01)
(52) U.S. Cl.
CPC ....... H05K 7/20927 (2013.01); *Y10T 29/49117* (2015.01)
(58) Field of Classification Search
CPC .......... H05K 7/20927; H05K 13/0486; H05K 7/20254; Y10T 29/49117
USPC .......... 361/688–723; 165/80.1–80.5, 165/104.11–104.34
See application file for complete search history.

(56) References Cited

U.S. PATENT DOCUMENTS

| 5,625,545 A | 4/1997 | Hammond |
| 5,638,263 A | 6/1997 | Abrams |
| 6,393,853 B1* | 5/2002 | Vukovic ................. H01L 23/473 165/80.4 |
| 2002/0105783 A1* | 8/2002 | Kitahara ............... G06F 1/1632 361/695 |
| 2004/0057211 A1* | 3/2004 | Kondo ...................... G06F 1/20 361/696 |
| 2007/0235167 A1* | 10/2007 | Brewer ..................... G06F 1/20 165/104.33 |
| 2012/0281359 A1* | 11/2012 | Arney ................ H05K 7/20645 361/701 |

FOREIGN PATENT DOCUMENTS

| DE | 102007013906 A1 | 10/2008 |
| FR | 2605481 A1 | 4/1998 |

OTHER PUBLICATIONS

U.S. Appl. No. 13/688,327, filed Nov. 29, 2012 entitled: Power Supplies Having Power Electronic Modules and Replacement Methods Thereof. (36 pages).

* cited by examiner

*Primary Examiner* — Anthony Haughton
*Assistant Examiner* — Yahya Ahmad

(57) ABSTRACT

Embodiments include a liquid cooled electronic device including a compartment configured to enclose an electronic module therein. The compartment includes a stationary cooling plate disposed on an interior portion of the compartment, the stationary cooling plate comprising a liquid cooling system configured to remove heat from the stationary cooling plate and a plurality of electrical connectors configured to connect to the electronic module. The electronic module includes a mobile cooling plate configured to intimately fit with the stationary cooling plate when the plurality of electrical connectors are connected to the electronic device module. The heat generated by the electronic module is removed by the mobile cooling plate and the stationary cooling plate.

15 Claims, 10 Drawing Sheets

LIQUID COOLED ELECTRONIC MODULES AND METHODS FOR REPLACING THE SAME

BACKGROUND

The present invention relates generally to an electronic device containing liquid cooled electronic modules, and methods for quickly removing and/or replacing electronic modules.

Normal operations of electronic devices are occasionally interrupted due to fault conditions. When this occurs, it is desirable to minimize the time required to repair the electronic device and return it to service. For this reason, electronic devices are often constructed with one or more electronic modules that can be quickly removed and replaced if needed.

In one example, an electronic device, such as a power supply, may have all the electronic components combined into a single module, which can be quickly removed and replaced without disturbing the enclosure, the incoming power connections, the circuit breaker, the outgoing power connections, or a combination of the above. In another example, a power supply may include several modules connected in parallel in order to increase the output current of the power supply. If one module fails, it can be quickly and conveniently replaced without disturbing the other modules or any of the other components of the power supply. In yet another example, a power supply may include several modules connected in series in order to increase the output voltage of the power supply. If one module fails, it can be quickly and conveniently replaced without disturbing the other modules or any of the other components of the power supply.

In general, the electronic modules may be air cooled or liquid cooled. In liquid cooled electronic devices, the electronic modules include one or more hydraulic connections where heat extracting fluids flow into and out of the electronic module under pressure. Quick replacement of air-cooled electronic modules can be achieved by providing plug-in connectors on the electronic module for the electrical connections. Liquid cooled electronic modules can also use plug-in connectors, but the replacement becomes more difficult due to the hydraulic cooling connections.

Accordingly, a need exists to provide a liquid cooled electronic module for an electronic device that can be replaced without disturbing the hydraulic cooling connections.

SUMMARY

According to one embodiment, a liquid cooled electronic device includes a compartment configured to enclose an electronic module therein. The compartment includes a stationary cooling plate disposed on an interior portion of the compartment, the stationary cooling plate comprising a liquid cooling system configured to remove heat from the stationary cooling plate and a plurality of electrical connectors configured to connect to the electronic module. The electronic module includes a mobile cooling plate configured to intimately fit with the stationary cooling plate when the plurality of electrical connectors are connected to the electronic device module. The heat generated by the electronic module is removed by flowing into the mobile cooling plate, then into the stationary cooling plate, and then into the cooling liquid.

According to another embodiment, a method of replacing a first electronic module disposed in a compartment of a liquid cooled electronic device includes moving the first electronic module to electrically disconnect the first electronic module from a plurality of electrical connectors and also separating a mobile cooling plate of the first electronic module from a stationary cooling plate affixed to the compartment. The method further includes removing the first electronic module from the compartment. The method further includes inserting a second electronic module in the compartment and moving the second electronic device module to electrically connect the second electronic module to the plurality of electrical connectors and also bringing a mobile cooling plate of the second electronic device into intimate contact with the stationary cooling plate.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features and advantages of the invention are apparent from the following detailed description taken in conjunction with the accompanying drawings in which:

DETAILED DESCRIPTION

A liquid cooled electronic module for an electronic device that can be replaced without disturbing the hydraulic cooling connections is provided. In exemplary embodiments, the liquid cooling mechanism for the electronic module is separated into two plates, one mobile cooling plate and one stationary cooling plate. In exemplary embodiments, the stationary cooling plate is disposed in the enclosure that houses the electronic module during operation, rather than within the electronic module. All of the hydraulic cooling connections are made to the stationary plate. In exemplary embodiments, the mobile cooling plate is disposed on an outer surface of the electronic module, and is positioned so that the mobile cooling plate makes thermal contact with the stationary plate when the electronic module is in the fully connected position. By separating the liquid cooled stationary plate from the electronic module, the electronic module may be replaced without disconnecting the pipes, hoses, etc. which are part of the liquid cooling system. In exemplary embodiments, the two cooling plates may have grooves and ridges that increase the surface area of contact, and may be coated with a thermally conductive grease to improve the heat transfer between them. The stationary plate of the cooling mechanism is configured to mate intimately with the mobile plate of the cooling mechanism disposed on the electronic module, to effectively remove the heat generated within the electronic module.

Figure 1:
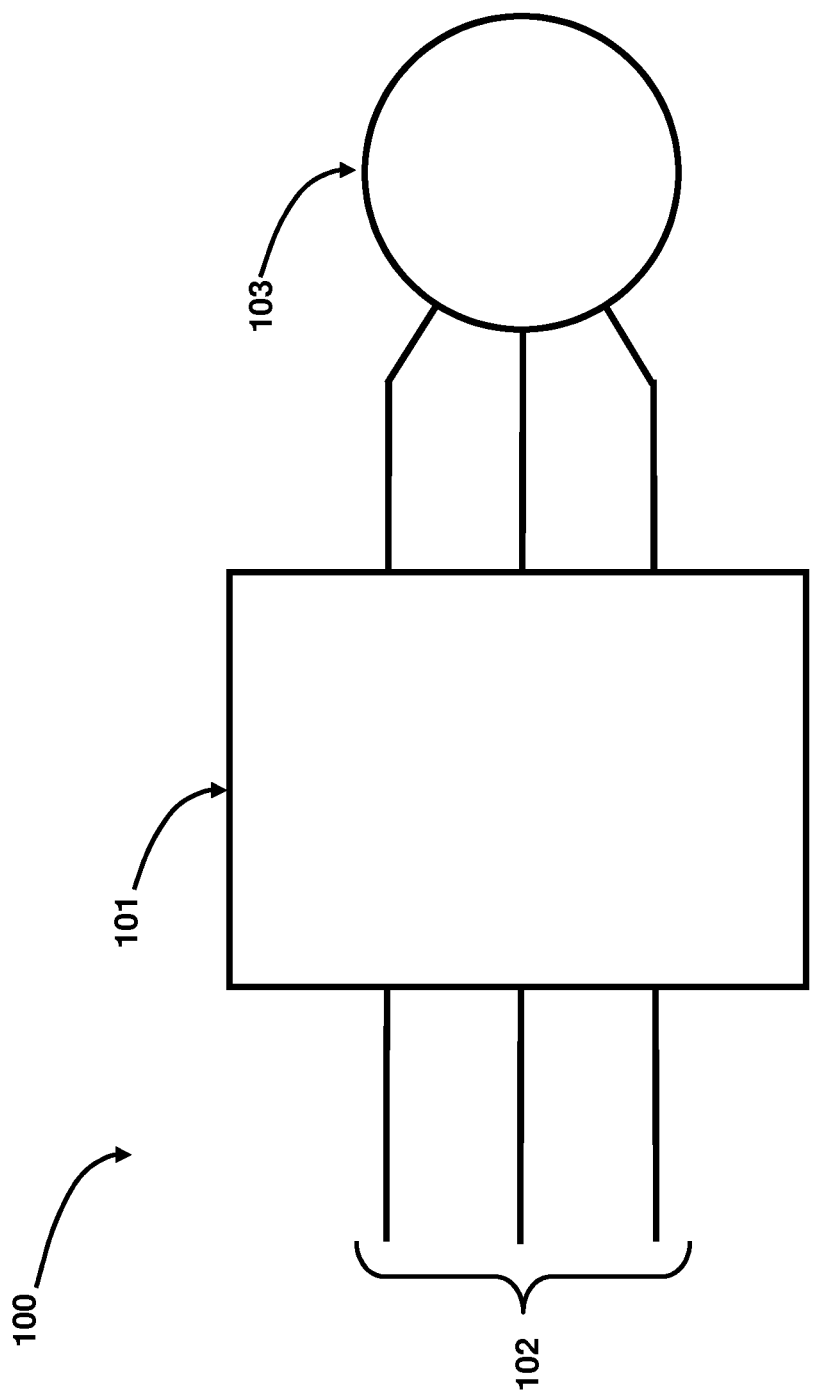
FIG. 1 illustrates a schematic diagram of a power supply having a single module according to the prior art.

FIG. 1 illustrates an example of a known power supply 100 having a single module 101. A three-phase AC input power source 102 is coupled to module 101 of the power supply 100. The power supply 100 may provide a variable frequency voltage and may be coupled to a load 103, such as a three-phase AC motor.

Figure 2:
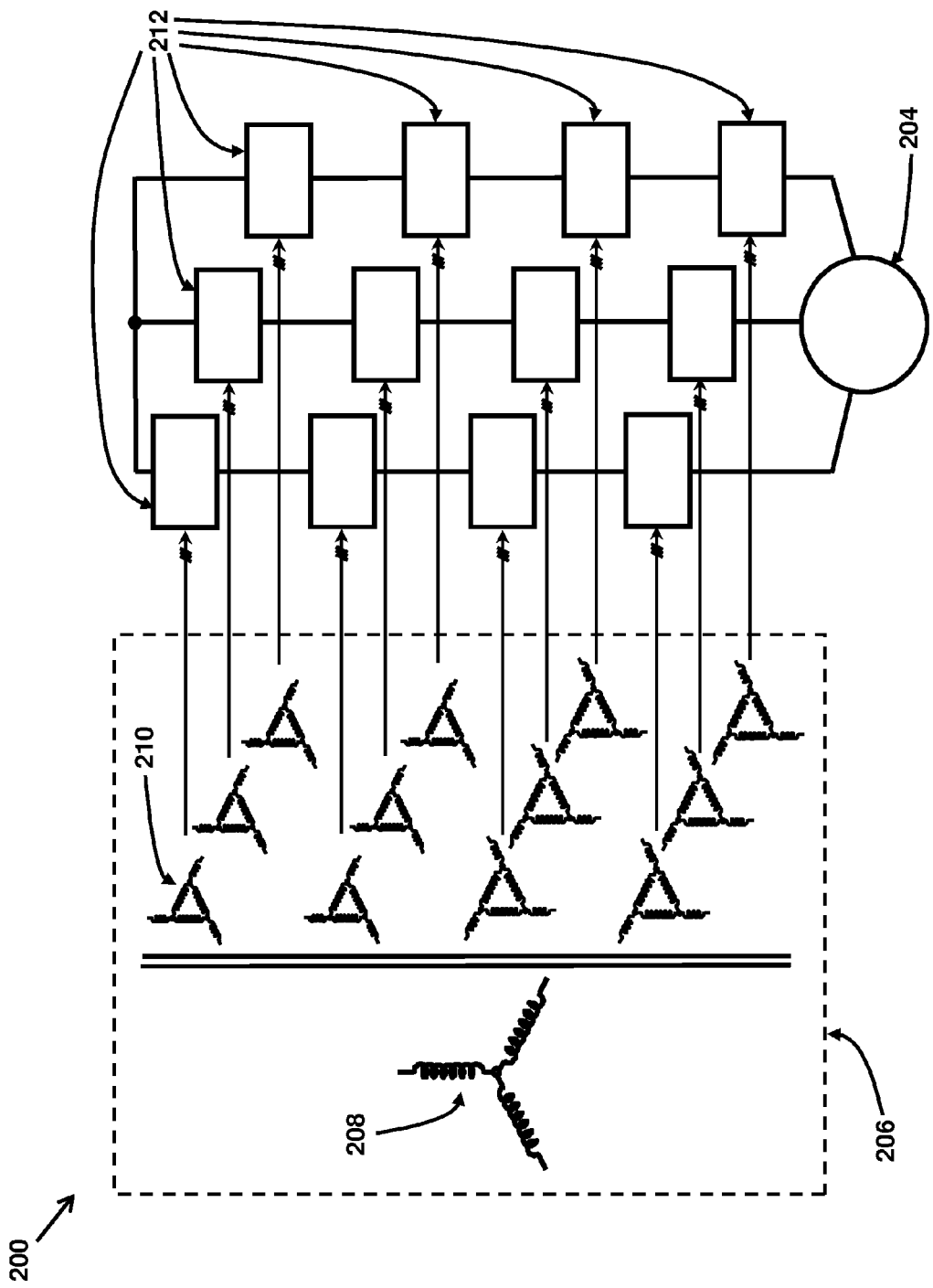
FIG. 2 illustrates a schematic diagram of a power supply having a plurality of series connected electronic modules according to the prior art.

FIG. 2 illustrates an example of a known power supply 200 having series connected electronic modules 212. The power supply 200 may provide a variable frequency voltage and may be coupled to a load 204, such as a three-phase AC motor. The power supply 200 includes a transformer 206 having a primary winding 208 and a plurality of secondary windings 210. The power supply 200 also includes a plurality of identical modules 212 and each secondary winding 210 may feed a respective module 212. Each of the electronic modules 212 can include an input AC-to-DC rectifier, a smoothing filter, and a single-phase output DC-to-AC converter employing pulse width modulation (PWM). The electronic modules 212 are configured in three groups wherein the outputs of each electronic module 212 in each group are connected in series to generate a voltage for one phase of the output power to the load 204. Power supply 200 includes twelve modules configured in three groups of four serially-connected modules each. An example of a power supply 200 and circuitry for electronic modules 212 is described in U.S. Pat. No. 5,625,545, which is hereby incorporated by reference herein.

Figure 3:
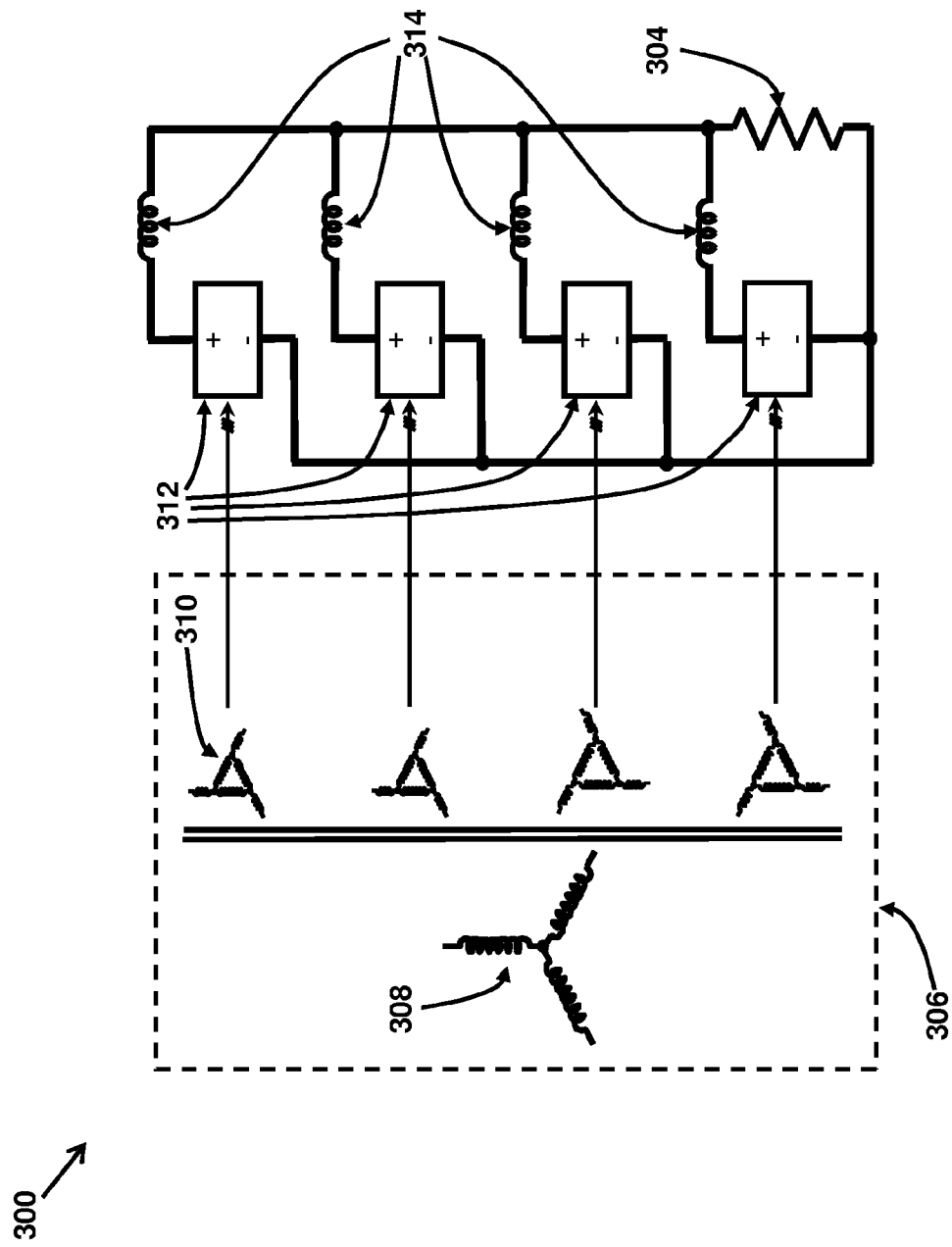
FIG. 3 illustrates a schematic diagram of a power supply having a plurality of parallel connected electronic modules according to the prior art.

FIG. 3 illustrates an example of a known power supply 300 having parallel connected electronic modules 312. The power supply 300 includes a transformer 306, which includes a primary winding 308 and a plurality of secondary windings 310. Each secondary winding 310 may feed a respective electronic module 312. The power supply 300 has a plurality of identical modules 312 coupled in parallel. Electronic modules 312 can include an input AC-to-DC rectifier, a smoothing filter, and an output DC-to-DC converter employing pulse width modulation (PWM). The negative output terminals of all electronic modules 312 are connected in parallel to the negative terminal of a load 304, which may be a resistance. The positive output terminals of all electronic modules 312 are connected through inductors 314 in parallel to the positive terminal of a load 304. An example of a power supply 300 and circuitry for the electronic modules 312 is described in U.S. Pat. No. 5,638,263, which is hereby incorporated by reference herein.

Figure 4:
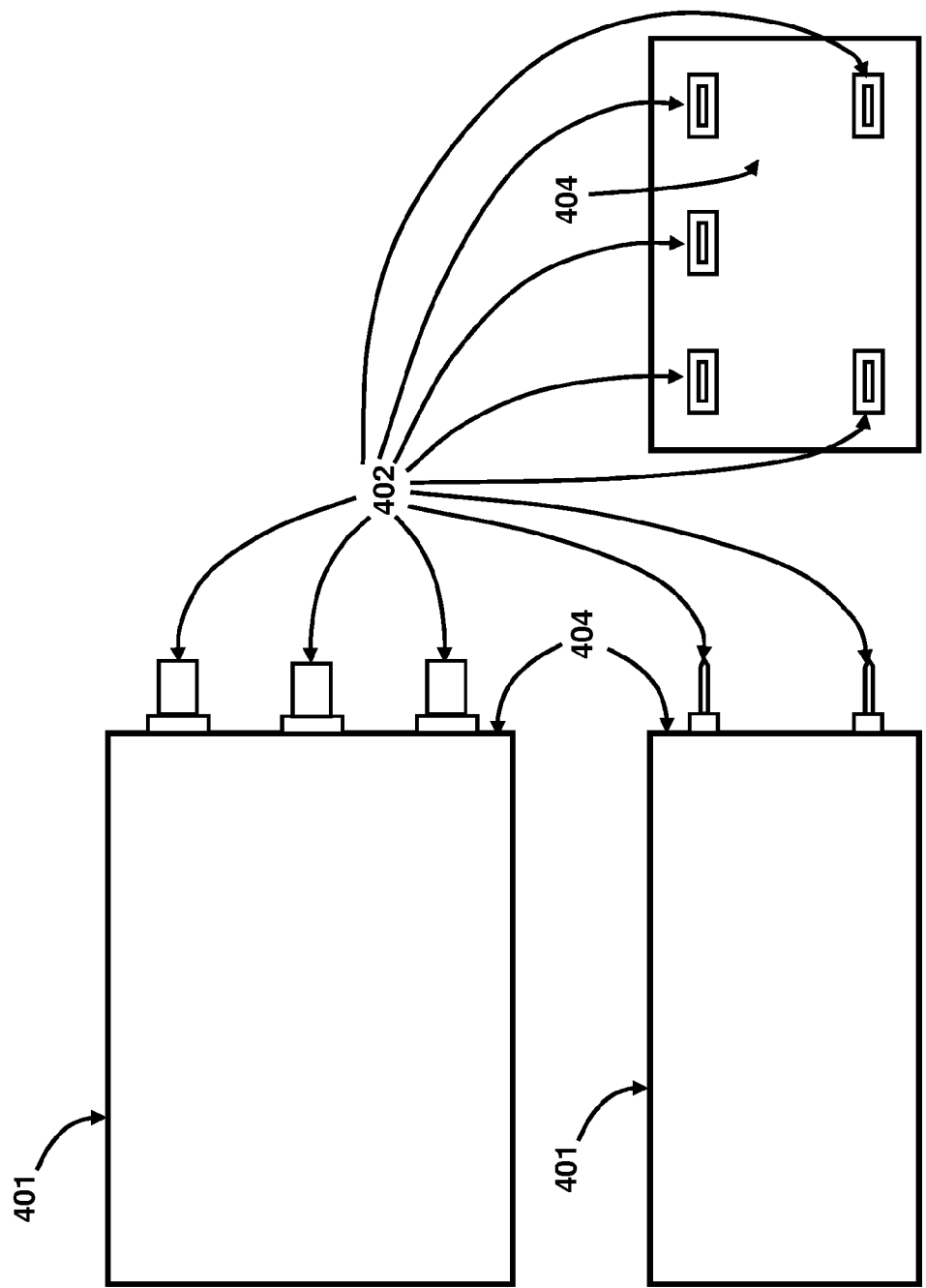
FIG. 4 illustrates top, side, and rear views of a electronic module configured with plug-in electrical connectors according to the prior art.

In the power supplies of FIGS. 1, 2, and 3, it is desirable to be able to quickly remove and replace a defective electronic module. FIG. 4 shows three views of a typical prior art electronic module 401 configured for quick replacement. Electronic modules 401 may have a plurality of electrical connectors 402 located on a rear surface 404. The electrical connectors 402 may include both input and output power connections. The electrical connectors 402 may be plug in connectors and may be connectable without hand tools and may be, e.g., metal blade connectors as shown, sized in accordance with the amount of current they are expected to conduct. The electrical connectors 402 may have other connector configurations that do not require hand tools for connection, such as, e.g., a pin and socket configuration and/or any other suitable plug-in type configuration. Electrical connectors 402 may be a male or female type of connector and may be made of any suitable electrically conductive material. Electrical connectors for control signals (not shown) may in some embodiments also be located on rear surface 404, and may also be connectable without hand tools.

Figure 5A:
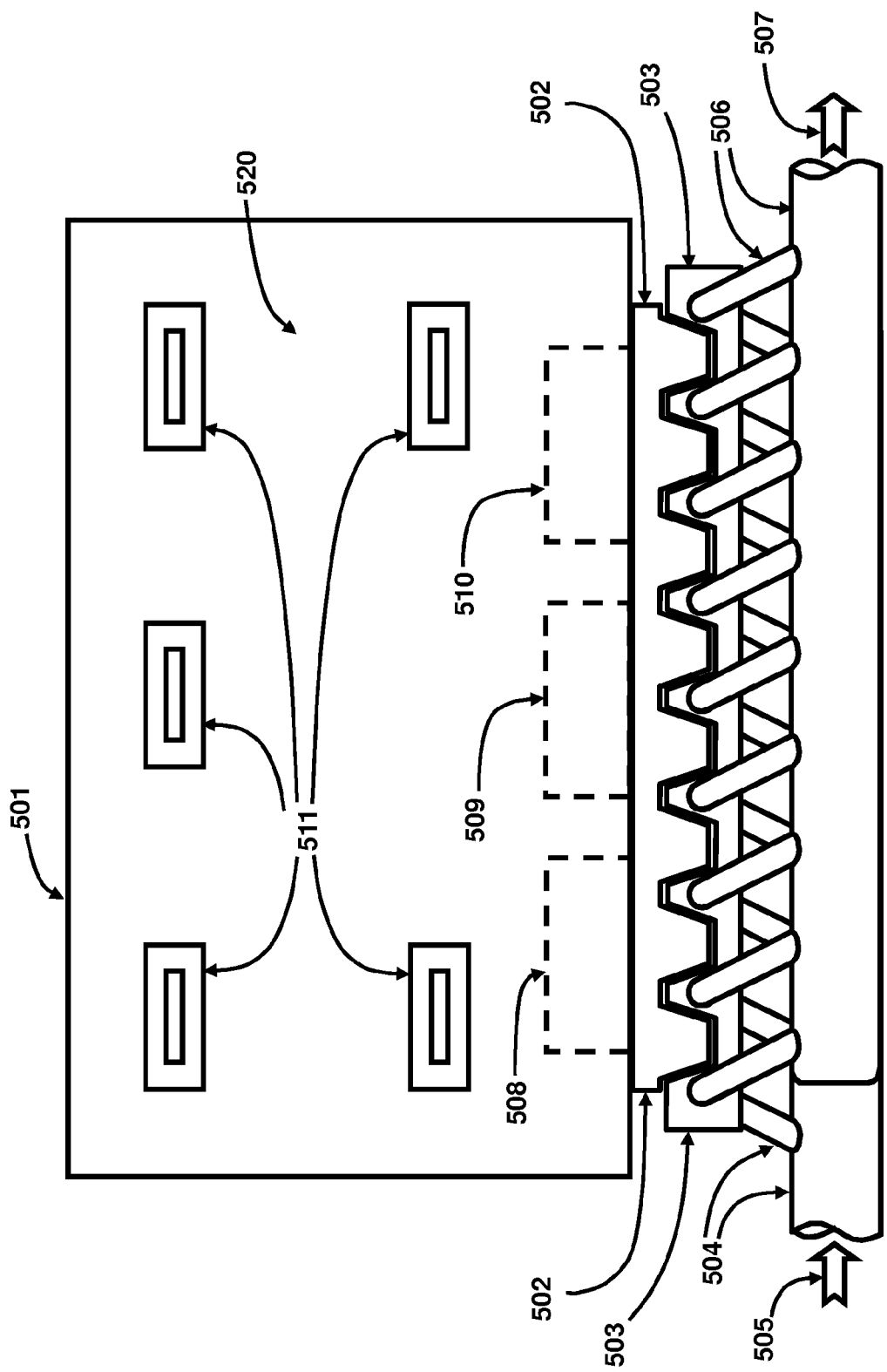
FIG. 5A illustrates a rear view of a liquid cooled electronic module in accordance with an exemplary embodiment.
Figure 5B:
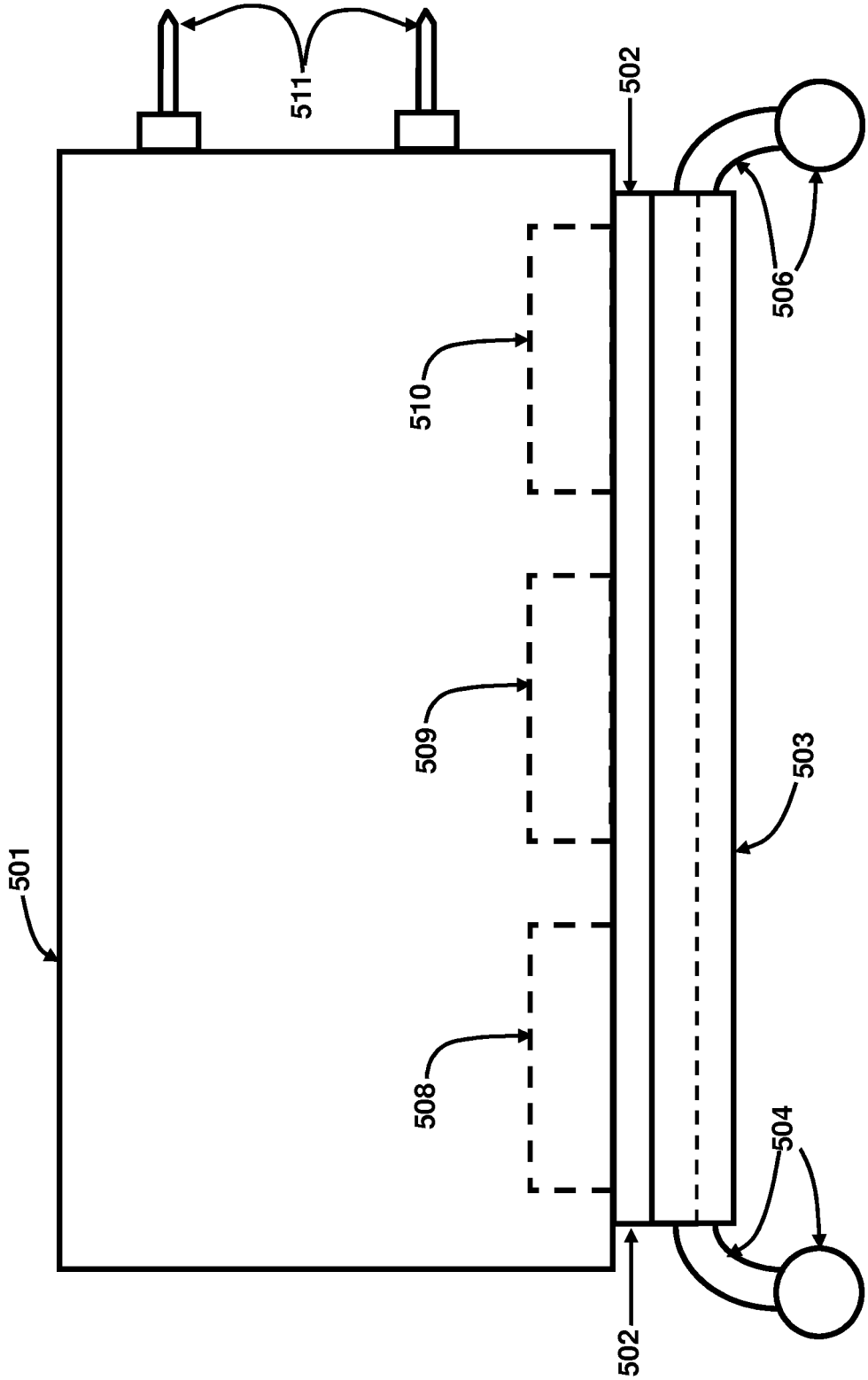
FIG. 5B illustrates a side view of a liquid cooled electronic module in accordance with an exemplary embodiment.

Referring now to FIG. 5A a rear view and FIG. 5B a side view of an exemplary embodiment of an electronic module 501 in accordance with an exemplary embodiment of this invention are respectively shown. In exemplary embodiments, the rear surface of module 520 has a plurality of electrical connectors 511, but other surfaces can also be used. In exemplary embodiments, the bottom surface of the electronic module 501 has a mobile cooling plate 502, but other surfaces of the electronic module 501 may also include a mobile cooling plate. In exemplary embodiments, the bottom surface of the electronic module 501 may include one or more openings so that various heat-producing components 508, 509, and 510 which require cooling can be mounted directly on the upper surface of the mobile cooling plate 502. The heat-producing components 508, 509, and 510 may be distributed in such a way as to keep the heat flow per unit area of the mobile cooling plate 502 as uniform as possible. In exemplary embodiments, a heat conducting element may be disposed either on or inside of the mobile cooling plate 502 to help spread the heat generated by electrical components of the first electronic device module across the mobile cooling plate 502. For example, heat pipes can be added to the mobile cooling plate 502 to help distribute the heat generated by the heat-producing components 508, 509, and 510 across the mobile cooling plate 502. In another example, a heat conducting element may be disposed on top of the mobile cooling plate 502 to help distribute the heat generated by the heat-producing components 508, 509, and 510 across the mobile cooling plate 502.

In exemplary embodiments, a bottom surface of the mobile cooling plate 502 may have a plurality of grooves and ridges that are configured to increase the surface area of the cooling plate 502 that is in contact with the stationary cooling plate 503. In one embodiment, the bottom surface of the mobile cooling plate 502 can also be coated with thermally conductive grease such as Wakefield Type 120, to further improve heat transfer between the mobile cooling plate 502 and the stationary cooling plate 503.

In exemplary embodiments, the stationary cooling plate 503 is mounted to the enclosure (not shown) where the electronic module 501 will be installed, and located so that the mobile cooling plate 502 of the electronic module 501 can contact it. The stationary cooling plate 503 may include a surface that has a plurality of grooves and ridges, which mate intimately with the ridges and grooves on the mobile cooling plate 502. In one embodiment, the grooves and ridges on both plates run parallel to each other, along a front to back axis, which will help facilitate a user sliding the electronic module 501 onto the stationary cooling plate 503 from the front, until the electrical connectors 511 on the rear surface engage their mating counterparts in the enclosure (not shown). In exemplary embodiments, the ridges and grooves are shown with an equidistant spatial distribution, however, it will be appreciated by those of ordinary skill in the art that a variety of configurations may be used. For example, a non-uniform distribution of the ridges, grooves and internal cooling channels may be used to compensate for lack of uniformity of heat dissipation on the mobile plate 502.

In exemplary embodiments, the stationary cooling plate 503 has a plurality of internal channels running front to back to carry the liquid coolant which flows under pressure. A supply manifold 504 may be disposed at one end of the stationary cooling plate 503 to receive the flow of incoming coolant 505, and to distribute the coolant 505 to the plurality of internal channels. A return manifold 506 may be disposed at the opposite end of the stationary cooling plate 503 to collect the coolant exhausted from the plurality of internal channels, and to deliver it to the flow of outgoing coolant 507.

Because the stationary cooling plate 503 is permanently mounted in the enclosure of the power supply, the pipes or hoses which carry the incoming coolant 505 and outgoing coolant 507 can also be permanently connected to the stationary cooling plate 503. In one embodiment, the entire cooling system can operate at ground potential, so that the pipes and mechanical supports connected to the stationary cooling plate 503 can be metal. In other embodiments, the stationary cooling plate 503 may be mounted on insulated supports and non-conductive pipes, hoses, and coolant can be used either for the totality or for a part of the cooling system.

In exemplary embodiment, both mobile cooling plate 502 and the stationary cooling plate 503 may be made from a material with low thermal resistance, such as copper or aluminum. In exemplary embodiments, the geometry of the mating surfaces of 502 and 503, such as the total area and the number, size, and location of the ridges, may be selected based on the operating conditions and environment of the electronic module 501 to provide for a desired amount of heat transfer.

In one embodiment, the electronic module 501 is small and light weight and it can be lifted manually off of the stationary cooling plate 503 and a replacement module can be lifted manually onto the stationary cooling plate 503. However, in other embodiments, the liquid cooled electronic modules may be large and heavy.

Figure 6A:
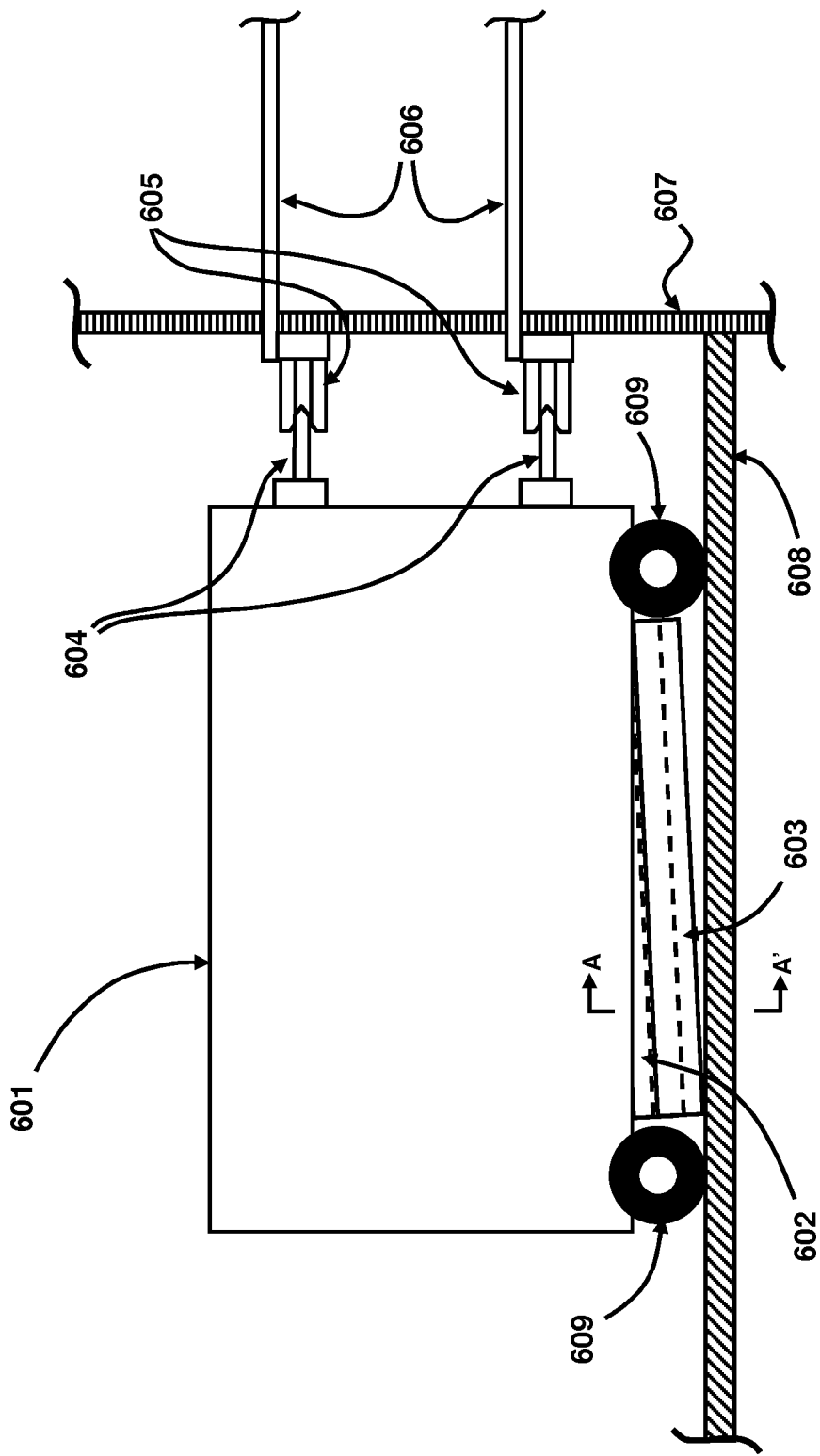
FIG. 6A illustrates a side view of a liquid cooled electronic module and a cooling device in a connected mode in accordance with an exemplary embodiment.
Figure 6B:
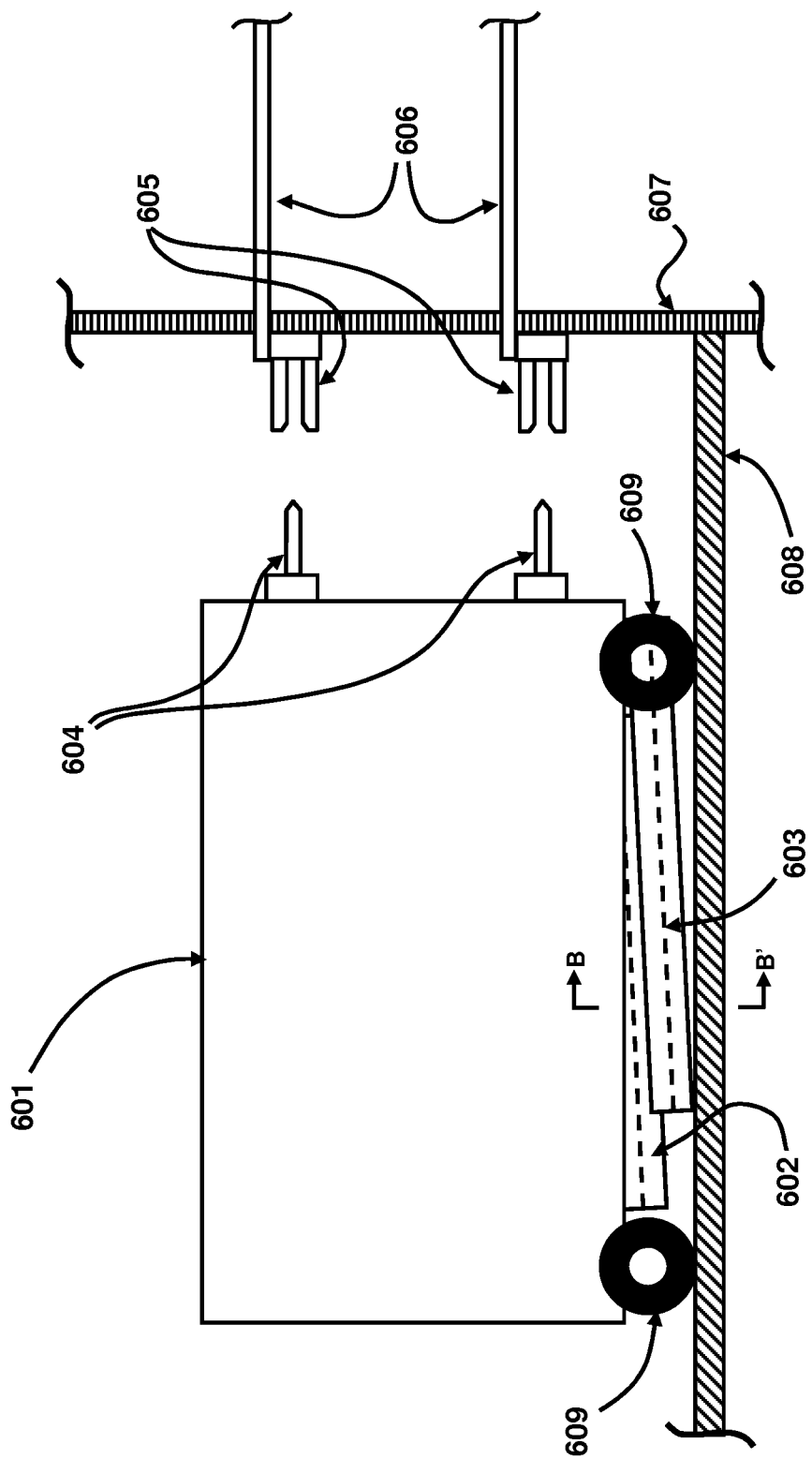
FIG. 6B illustrates a side view of a liquid cooled electronic module and a cooling device in a disconnected mode in accordance with an exemplary embodiment.

Referring now to FIGS. 6A and 6B, side views of a large and heavy liquid cooled electronic module 601 in connected and disconnected conditions are respectively shown. The electronic module 601 may be equipped with wheels 609, which roll on a horizontal surface 608 in the power supply enclosure. In some cases the surface 608 can be grounded metal, but in other cases it is made from an insulating material. The electronic module 601 is placed on the surface 608 from the front of the enclosure (left in FIGS. 6A and 6B), and rolled into position until the power connectors 604 on the rear surface of the electronic module 601 engage the corresponding connectors 605 on a vertical insulating panel 607 in the power supply enclosure, as shown. Bus bars or cables 606 carry current to and from the connectors 605.

In exemplary embodiments, the mobile cooling plate 602 is mounted to the electronic module 601 so that it slopes down toward the front (left in FIGS. 6A and 6B) at a small angle. The stationary cooling plate 603 is mounted to the surface 608 of the power supply enclosure so that it also slopes down toward the front at the same small angle. The cooling plates 602, 603 are located so that, as the electronic module 601 is rolled toward the vertical insulating panel 607, the cooling plates 602, 603 make contact a few millimeters before the connectors 604 and 605 become fully engaged. In exemplary embodiments, during the last few millimeters of travel, the electronic module 601 rides up onto the stationary cooling plate 603, so that most of the weight of the electronic module 601 is transferred from the wheels 609 to the cooling plates 602, 603. The weight pressing the two cooling plates 602, 603 together improves the heat transfer between the cooling plates 602, 603.

Figure 7A:
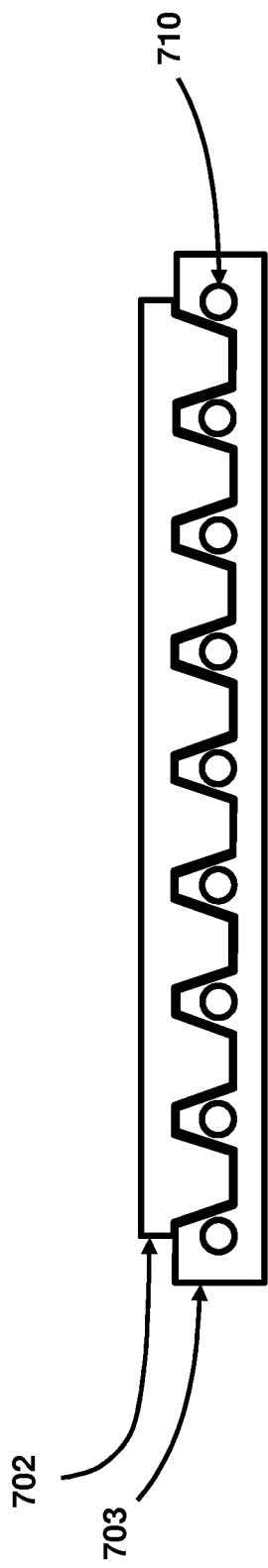
FIG. 7A illustrates a cross sectional view of the liquid cooled electronic module and the cooling device of FIG. 6A in accordance with an exemplary embodiment.
Figure 7B:
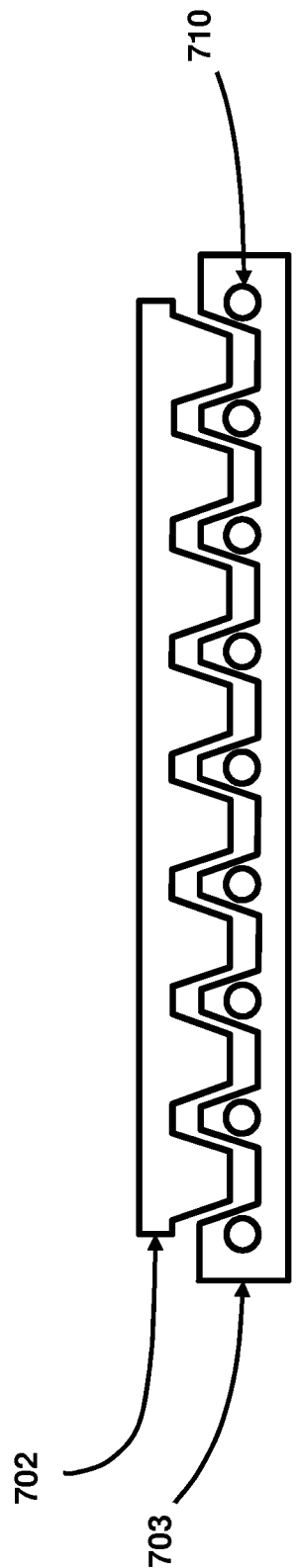
FIG. 7B illustrates a cross sectional view of the liquid cooled electronic module and the cooling device of FIG. 6B in accordance with an exemplary embodiment.

Referring now to FIGS. 7A and 7B, cross-sectional views of the two cooling plates shown in FIGS. 6A and 6B, taken along line A-A' and B-B' are respectively shown. As shown in FIG. 7A, when the electronic module is in a connected position, the cooling plates 702, 703 are in close contact. As shown in FIG. 7B, when the electronic module is in a disconnected position, the cooling plates 702, 703 are not in direct contact. In exemplary embodiments, either or both of the cooling plates 702 may be coated with a thermally conductive grease to improve the heat transfer between them. In exemplary embodiment, the stationary cooling plate 703 includes a plurality of channels 710 for circulating a cooling fluid of the liquid cooling system.

Figure 8:
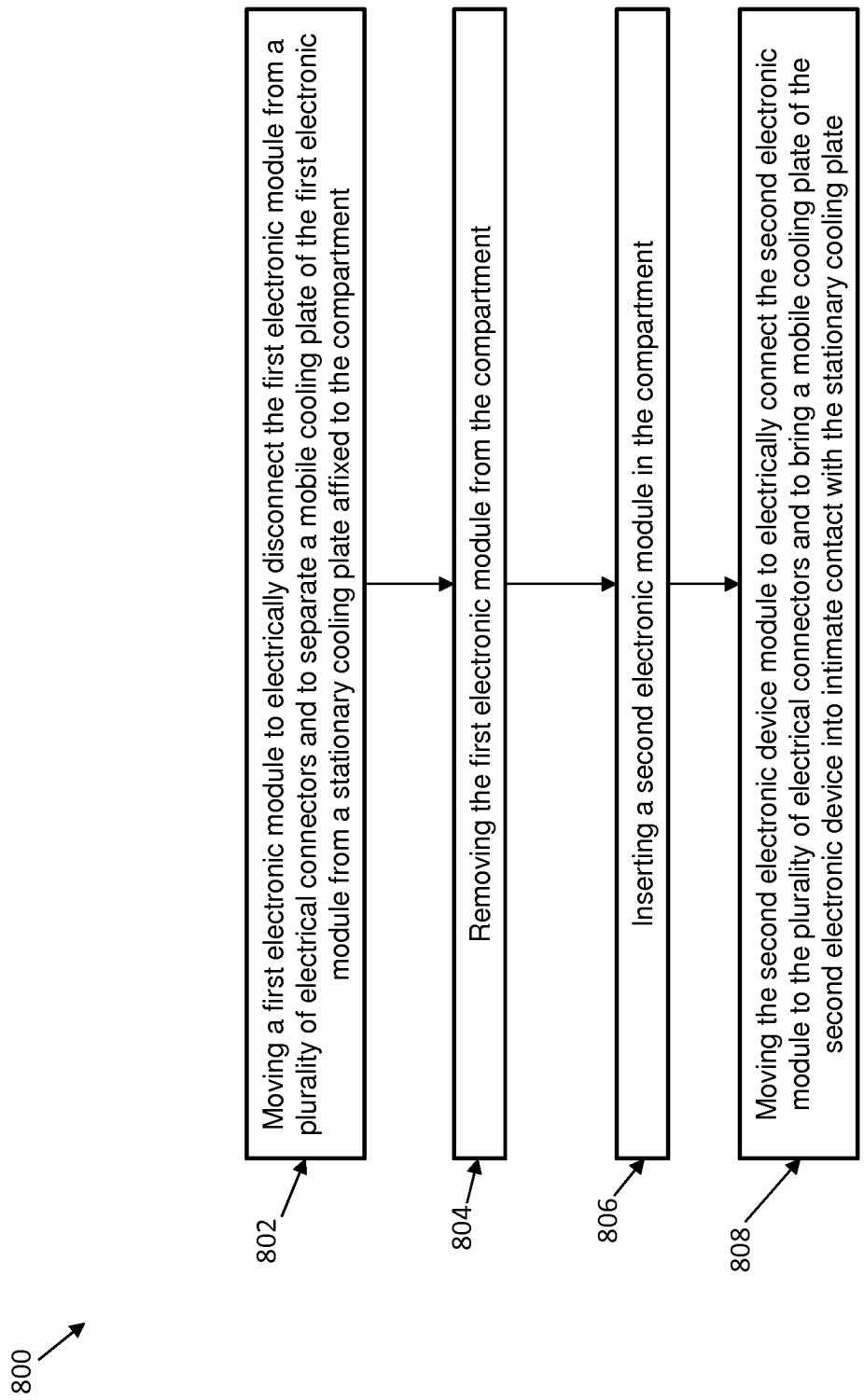
FIG. 8 is a flow chart diagram illustrating a method for replacing an electronic module of a liquid cooled electronics device in accordance with an exemplary embodiment.

Referring now to FIG. 8, a flow chart diagram of a method 800 for replacing an electronic module of a liquid cooled electronics device in accordance with exemplary embodiments is shown. The electronics device includes at least one electronic module enclosed in a dedicated compartment. In exemplary embodiments, the cooling system includes a stationary cooling plate disposed in each compartment of the electronics device and a mobile cooling plate affixed to each electronic module. As shown at block 802, method 800 may include moving a first electronic module to electrically disconnect the first electronic module from a plurality of electrical connectors of the electronics device. For example, a first electronic module may be moved in a direction away from the stationary electrical connectors and toward front wall and door. This movement may cause the electrical connectors of electronic module to electrically disconnect from the stationary electrical connectors as the electronic module moves from the connected mode to the disconnect mode. In addition, this movement will cause the mobile cooling plate of the electronic module to disengage from the stationary cooling plate disposed in the compartment.

Continuing with reference to FIG. 8, as shown at block 804, the method 800 includes removing the first electronic module from the compartment. As shown at block 806, the method 800 includes inserting a second electronic module in the compartment. As shown at block 808, method 800 includes moving the second electronic device module to electrically connect the second electronic module to the plurality of electrical connectors and to bring a mobile cooling plate of the second electronic device into intimate contact with the stationary cooling plate.

Although the invention has been discussed primarily with reference to a power supply and modules, it will be appreciated by those of ordinary skill in the art that the invention is not limited to such devices and may be applied to any electronic device having removable modules.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A liquid cooled electronic device comprising:
   a compartment configured to enclose an electronic module therein, the compartment comprising:
   a stationary cooling plate disposed on an interior portion of the compartment, the stationary cooling plate comprising a liquid cooling system configured to remove heat from the stationary cooling plate; and
   a plurality of electrical connectors configured to connect to the electronic module;
   wherein the electronic module comprises:
      a mobile cooling plate configured to intimately fit with the stationary cooling plate when the plurality of electrical connectors are connected to the electronic device module;
   wherein the heat generated by the electronic module is removed by the mobile cooling plate and the stationary cooling plate,
   wherein the stationary cooling plate comprises a first plurality of ridges and grooves with an equidistant distribution,
   wherein the mobile cooling plate of the electronic module comprises a second plurality of ridges and grooves with an equidistant distribution,
   wherein the stationary cooling plate comprises a plurality of channels for circulating a cooling fluid of the liquid cooling system, and
   wherein each of the plurality of channels are disposed adjacent to one or more of the second plurality of ridges and grooves when the plurality of electrical connectors are connected to the electronic module.

2. The liquid cooled electronic device of claim 1, wherein the electronic module includes a heat conducting element configured to spread heat generated by electrical components of the electronic module across the mobile cooling plate.

3. The liquid cooled electronic device of claim 1, wherein thermal grease is disposed between the mobile cooling plate of the electronic module and the stationary cooling plate.

4. The liquid cooled electronic device of claim 1, wherein the geometry of the mobile cooling plate and of the stationary cooling plate is based on a desired heat transfer rate from the electronic device module.

5. The liquid cooled electronic device of claim 1, wherein the plurality of electrical connectors are connectable without hand tools.

6. The liquid cooled electronic device of claim 1, further comprising a moveable guide configured to guide the electronic device module into or out of electrical contact with the plurality of electrical connectors.

7. A method of replacing an electronic device module disposed in a compartment of a liquid cooled electronic device, comprising:
   moving a first electronic module to electrically disconnect the first electronic module from a plurality of electrical connectors and to separate a mobile cooling plate of the first electronic module from a stationary cooling plate affixed to the compartment;
   removing the first electronic module from the compartment;
   inserting a second electronic module in the compartment; and
   moving the second electronic device module to electrically connect the second electronic module to the plurality of electrical connectors and to bring a mobile cooling plate of the second electronic device into intimate contact with the stationary cooling plate affixed to the compartment,
   wherein the stationary cooling plate comprises a plurality of channels for circulating a cooling fluid of a liquid cooling system,
   wherein the stationary cooling plate comprises a first plurality of ridges and grooves,
   wherein a surface of the mobile cooling plate of the second electronic device module comprises a second plurality of ridges and grooves,
   wherein each of the plurality of channels are disposed adjacent to one or more of the second plurality of ridges and grooves when the plurality of electrical connectors are connected to the second electronic device module.

8. The method of claim 1, wherein the mobile cooling plate of the first electronic module is configured to intimately fit with the stationary cooling plate when the plurality of electrical connectors are connected to the first electronic device module.

9. The method of claim 4, wherein the first electronic module includes a heat conducting element configured to spread heat generated by electrical components of the first electronic module across the mobile cooling plate.

10. The method of claim 4, wherein thermal grease is disposed between the mobile cooling plate of the first electronic device module and the stationary cooling plate.

11. The method of claim 4, wherein a surface of the mobile cooling plate of the first electronic device module comprises a plurality of ridges.

12. The method of claim 1, wherein the mobile cooling plate of the second electronic module is configured to intimately fit with the stationary cooling plate when the plurality of electrical connectors are connected to the second electronic device module.

13. The method of claim 1, wherein the second electronic module includes a heat conducting element configured to spread heat generated by electrical components of the second electronic device module across the mobile cooling plate.

14. The method of claim 1, wherein thermal grease is disposed between the mobile cooling plate of the second electronic device module and the stationary cooling plate.

15. The method of claim 4, wherein the mobile and stationary cooling plates slope down at a small angle away from the electrical connectors, so when the second electronic module is installed the mobile cooling plate of the second electronic module slides up onto the stationary cooling plate as the electrical connectors are engaging, thereby causing the weight of the second electronic module to press the mobile cooling plate onto the stationary cooling plate to improve the heat transfer.

* * * * *